US007918935B2

(12) United States Patent
Park et al.

(10) Patent No.: US 7,918,935 B2
(45) Date of Patent: Apr. 5, 2011

(54) TRANSITION METAL OXIDE NANOWIRES

(75) Inventors: Hongkun Park, Lexington, MA (US); Charles M. Lieber, Lexington, MA (US); Jeffrey J. Urban, Cambridge, MA (US); Qian Gu, Cambridge, MA (US); Wan Soo Yun, Somerville, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 657 days.

(21) Appl. No.: 11/765,177

(22) Filed: Jun. 19, 2007

(65) Prior Publication Data
US 2008/0003839 A1 Jan. 3, 2008

Related U.S. Application Data

(62) Division of application No. 10/483,935, filed as application No. PCT/US02/23062 on Jul. 22, 2002, now abandoned.

(60) Provisional application No. 60/306,936, filed on Jul. 20, 2001.

(51) Int. Cl.
C30B 29/16 (2006.01)
(52) U.S. Cl. ............... 117/68; 117/70; 117/73; 117/74
(58) Field of Classification Search .................. 117/68, 117/70, 73, 74
See application file for complete search history.

(56) References Cited

U.S. PATENT DOCUMENTS

| 5,897,954 | A | 4/1999 | Gimzewski et al. |
| 5,932,309 | A | 8/1999 | Smith et al. |
| 6,036,774 | A | 3/2000 | Lieber et al. |
| 6,210,080 | B1 | 4/2001 | Haul et al. |
| 6,210,800 | B1 | 4/2001 | Nesper et al. |
| 6,225,198 | B1 | 5/2001 | Alivisatos et al. |
| 6,306,736 | B1 | 10/2001 | Alivisatos et al. |
| 6,465,132 | B1 | 10/2002 | Jin |
| 6,780,116 | B2 | 8/2004 | Hurst et al. |
| 6,780,845 | B2 | 8/2004 | Blaschuk et al. |
| 6,781,166 | B2 | 8/2004 | Lieber et al. |
| 6,786,950 | B2 | 9/2004 | Yadav et al. |
| 6,788,453 | B2 | 9/2004 | Banin et al. |

FOREIGN PATENT DOCUMENTS

JP 06 287 154 A 10/1994

OTHER PUBLICATIONS

Yoshimoto, M. et al., "Characterization and Application of the Ultrasmooth surface Nanostructure of Metal Oxides", *Journal of the Surface Society of Japan*, 21(2):71-80 (2000).
Abstract of JP 06 135720 A (Murata Mfg Co Ltd), May 17, 1994.
Abstract of JP 06 287154 (TDK Corp; Others: 01), Oct. 11, 1994.
Abstract of JP 56 149709 A (Matsushita Elec Ind Co Ltd), Nov. 19, 1981.
Abstract of JP 59 223232 A (Taiyou Yuuden KK), Dec. 15, 1984.
Abstract of Saifi et al. "Growth of teragonal BaTiO3 single crystal fibers" Journal of Materials Research, May-Jun. 1986, USA, vol. 1, No. 3, pp. 452-456.

(Continued)

*Primary Examiner* — Robert M Kunemund
(74) *Attorney, Agent, or Firm* — Alan W. Steele; Foley Hoag LLP

(57) ABSTRACT

Nanowires are disclosed which comprise transition metal oxides. The transition metal oxides may include oxides of group II, group III, group IV and lanthanide metals. Also disclosed are methods for making nanowires which comprise injecting decomposition agents into a solution comprising solvents and metallic alkoxide or metallic salt precursors.

6 Claims, 12 Drawing Sheets

OTHER PUBLICATIONS

Limmer, S. J. et al. "Electrophoretic Growth of Lead Zirconate Titanate Nanorods" Advanced Materials, VCH Verlagsgesellschaft, Weinheim, DE, vol. 13, No. 16, Aug. 16, 2001, pp. 1269-1272.

Matsuda, H. et al. "Stress-Induced Resistivity Anomaly in Semiconducting Barium Titanate Ceramic Wire" Journal of the American Ceramic Society, vol. 81, No. 1, 1998, pp. 229-232.

Urban, J. J. et al. "Synthesis of single-crystalline perovskite nanorods composed of barium titanate and strontium titanate" Journal of the American Chemical Society, vol. 124, No. 7, Feb. 20, 2002, pp. 1186-1187.

Zhang, Y. F. et al. "Yttrium-barium-copper-oxygen nanorods synthesized by laser ablation" Chemical Physics Letters, vol. 323, Jun. 9, 2000, pp. 180-184.

TRANSITION METAL OXIDE NANOWIRES

RELATED APPLICATIONS

This application is a divisional of and claims the benefit of priority to U.S. patent application Ser. No. 10/483,935, filed Oct. 7, 2004; which is a National Stage entry of and claims the benefit of priority to Patent Cooperation Treaty Application number PCT/US02/23062, filed Jul. 22, 2002; which claims the benefit of priority to U.S. Provisional Patent Application Ser. No. 60/306,936, filed Jul. 20, 2001.

GOVERNMENT SUPPORT

This invention was made with government support under N00014-01-10651 and N00014-00-1-0476 awarded by U.S. Office of Navy Research. The government has certain rights in the invention.

BACKGROUND OF THE INVENTION

Bulk transition metal oxides that exhibit ferroelectric, piezoelectric, converse piezoelectric, pyroelectric, magnetoresistive, and high-permittivity dielectric properties have been widely used in industry to fabricate various memory devices, ferroelectric capacitors, electromechanical actuators, resonators, sensors, optical switches and waveguides. For example, these transition metal oxides may be used in non-volatile ferroelectric random-access memory (NV-FRAM) devices. The basis of NVRAM devices may be the ferroelectric property of the material. Ferroelectric properties of a material include the spontaneous permanent dipole moment exhibited by the material that can be reoriented by external electric field. NVFRAM devices use non-volatile ferroelectric polarization in lieu of field-effect gates and modulate the conductance of the doped semiconductor materials. Nonvolatile FRAMs may be used in consumer electronics, such as smart cards, and may be used as the next-generation memory architecture to replace dynamic RAMs (DRAMs).

These metal oxides may also be used as ferroelectric dynamic random-access memory (FDRAM) devices. Ferroelectric materials exhibit a high permittivity, for example, $\epsilon > 300$ for barium strontium titanate compared to $\epsilon = 7$ in silicon oxide, which may be exploited to make charge-storage and DRAM devices. FDRAMs work in a similar fashion to conventional DRAMs and store information as charge in a capacitor. The high permittivity of a ferroelectric material allows the significant reduction in the capacitor size and hence the size of the whole RAM device.

Ferroelectric oxides typically exhibit a host of other related properties, such as piezoelectricity, pyroelectricity, and large nonlinear optical coefficients. Central to all these diverse properties of ferroelectric oxides is the structural phase transition of the underlying oxide lattice, wherein below a certain phase transition temperature, the crystal lattice as a whole develops a spontaneous dipole moment or polarization and becomes ferroelectric. The same distortion of the unit cell, added together coherently throughout the crystal, also results in the deformation of the whole crystal that leads to piezoelectricity. In addition, owing to the loss of the inversion symmetry, the crystal in the tetragonal phase exhibits a large second order optical susceptibility that is responsible for second harmonic generation.

Converse-piezoelectric, that is, the deformation of the material upon the application of the electric field, and piezoelectric applications of bulk transition metal oxides may also be used as the basis of bulk and micrometer-sized electromechanical actuators, pumps, and more generally the whole class of micro-electromechanical systems (MEMS). Examples of converse-piezoelectric applications include piezoelectric actuators employed to move and position an object down to Ångstrom precision and the piezoelectric fluid pumps used in inkjet-printer heads. The piezoelectric property exhibited by the material, i.e., the development of voltage (or surface charge) upon the deformation of materials, is the physical basis of force and motion sensors, and resonators. Some examples of sensor applications are piezo-cantilevers used in atomic force microscopy to sense feature heights and accelerometers used to deploy air bags in motor vehicles. The resonator applications utilize both converse-piezoelectric and piezoelectric properties of the material to drive mechanical oscillations of the material using electrical inputs and to detect these resonant oscillations electrically. These resonators can be used as high-frequency bandpass filters in telecommunication systems, replacing bulky inductive-capacitance (L-C filters.

The pyroelectric properties exhibited by bulk transition metal oxide materials, including the change of voltage between opposite faces of the material with a change in temperature, is the physical basis of sensitive temperature and infrared sensors. Dielectric properties of bulk transition metal oxides may also lend themselves to use in integrated circuits and other semiconductor applications.

Another interesting member of the transition metal oxide family are the doped lanthanum manganites. In the bulk, these transition metal oxides have stimulated considerable scientific and technological interest due to its amazing variety of electronic and magnetic properties, including charge and orbital ordering, metal/insulator and ferromagnet/antiferromagnet transitions, lattice and magnetic polarons, and colossal magnetoresistance (CMR).

Magnetoresistive perovskite manganites are currently used in many business sectors such as consumer electronics, the wireless telephone industry, and the automobile industry. These industries currently employ large and expensive magnetic field sensors in their products. The development of nanocrystalline manganite sensors could greatly impact these fields.

Experimental studies have been performed on the effects of reduced dimensionality on the phase transitions of metal oxides, including thin film ferroelectric oxides and single crystal samples. However, existing preparation of nanocrystal solids of ferroelectric oxides for example, such as sol-gel synthesis and co-precipitation have yielded highly agglomerated samples with poor crystalline quality. No general synthetic route has existed for the synthesis of nanocrystals with more than two elements.

Previous investigations of thin-film and nanocrystalline samples have shown that their physical properties are critically dependent on their dimension. Despite intensive experimental efforts, however, a general method to synthesize well-isolated crystalline nanostructures of for example, perovskite oxides has been lacking.

SUMMARY

This application generally relates to nanowires comprising transition-metal-oxides.

In one embodiment, the nanowires comprise a transition metal oxide represented by $$A_xA'_{1-x}M_yM'_{1-y}O_3$$

wherein:
A and A' are each independently selected from group II, group III, group IV and lanthanide metals;
M and M' are independently for each occurrence a transition metal;
x is a whole or fractional number between 0 and 1 inclusive; and y is a whole or fractional number between 0 and 1 inclusive.

The numbers represented by x and y may be selected such that the sum of the valency of A, A', M and M' is about 0. In one embodiment, M and M' are independently selected from Ti, Zr, Mn, Tc, and Re.

In another embodiment, the nanowires comprise a transition metal oxide represented by $$A_xA'_{1-x}M_yM'_{1-y}O_3$$

wherein:
A and A' are each independently selected from group II and group IV metals;
M and M' are each independently a group IVB metal;
x is a whole or fractional number between 0 and 1 inclusive; and
y is a whole or fractional number between 0 and 1 inclusive.

In a particular embodiment, the group II and group IV metals are selected from Ba, Pb, and Sr. In another particular embodiment, the transition metal is tetravalent. In another embodiment, the transition metals or group IV metal is selected from Ti and Zr.

In one embodiment, x is about 1, y is about 0, and A is Ba. In another embodiment, x is about 0, y is about 1, and M is Ti or Zr.

In another embodiment, the nanowires comprise the transition metal oxides $BaTiO_3$, $PbZrO_3$, $PbZr_yTi_{1-y}O_3$ or $Ba_xSr_{1-x}TiO_3$, wherein x is a whole or fractional number between 0 and 1 inclusive, and y is a whole or fractional number between 0 and 1 inclusive.

In another embodiment, the nanowires comprise a transition metal oxide represented by $$A_xA'_{1-x}MO_3$$

wherein:
A is a lanthanide metal;
A' is a divalent metal;
M is a tetravalent metal; and
x is a whole or fractional number between 0 and 1 inclusive.

In an embodiment, M is selected from Mn, Tc, and Re. In another embodiment, A' is Ca. In yet another embodiment, A is La. In yet another embodiment, x is about 1 and A is La. In another embodiment, x is about 0 and A' is Ca.

In one embodiment, the length of the nanowire is greater than 100 nm, greater than 1 μm, greater than 5 μm, greater than 10 μm, or even greater than 50 μm. In yet another embodiment, the diameter of the nanowire is less than 500 nm, less than 100 nm, less than 50 nm, less than 5 nm, or even less than 1 nm.

In another aspect, this disclosure relates to the method of preparation of transition-metal-oxide nanowires comprising:
a) injecting a decomposition agent into a solution comprising a solvent, a coordinating ligand, and a precursor metallic alkoxide or metallic salt; and
b) heating said solution.

In certain embodiments, the solution is heated to above about 200° C., above about 240° C., or even above about 260° C. In one embodiment, the precursor alkoxide has the form AM-alkoxide, wherein A is divalent metal and M is a tetravalent metal. In another embodiment, the solution further comprises another A'M' alkoxide or salt. In an embodiment, the solvent has a boiling point above about 110° C., above about 150° C., about 200° C., or even above about 250° C. In another embodiment, the solvent is an organic solvent. In an embodiment, the organic solvent may be an aliphatic compound, an aromatic compound or an alkyl. In one embodiment, the organic solvent is a long chain alkyl, or higher alkyl. In another embodiment, the organic solvent is heptadecane.

In another embodiment, the coordinating ligand may be an acid or amine. In an embodiment, the coordinating ligand may be an amphipathic compound. In one embodiment, the coordinating ligand is an alkylamine with a long chain alkyl moiety or hydrocarbon. In a further embodiment, the coordinating ligand may be selected from bis (2-ethylhexyl) amine, tridodecylamine, palmitic acid, trihexylamine, tridecylamine, lauric acid, oleic acid, and trioctylamine.

In another embodiment, the method comprises injecting one or more decomposition agents. In an embodiment, the decomposition agents may be an oxidant. Decomposition agents may include peroxides, chlorates perchlorates, nitrates, permanganates and water. Decomposition agents may be, for example, hydrogen peroxide or water.

The precursor alkoxide may be a bimetallic alkoxide. In an embodiment, the precursor alkoxides are metallic or bimetallic isopropoxides. In a further embodiment, the precursor alkoxides are $BaTi[OCH(CH_3)_2]_6$, or $SrTi[OCH(CH_3)_2]_6$. In another embodiment, the precursor alkoxide may be for example, $Mn(O\ i\text{-}Pr)_2$ or $Mn(OAc)_2.4\ H_2O$.

In yet another embodiment, the precursor metallic salt may have the form MX, wherein M is a trivalent or tetravalent metal, and X may be any metallic salt moiety, for example a conjugate acid or a conjugate base.

In another embodiment, this disclosure relates to the method of preparation of transition metal oxides of the general formula $$A_xA'_{1-x}M_yM'_{1-y}O_3$$

wherein:
A and A' are each independently selected from group II and group IV metals;
M and M' are each independently a group IVB metal;
x is a whole or fractional number between 0 and 1 inclusive; and
y is a whole or fractional number between 0 and 1 inclusive; the method comprising:
a) injecting a decomposition agent into a solution comprising a solvent and a precursor metallic alkoxide or metallic salt; and
b) heating said solution.

In yet another embodiment, this disclosure relates to a method of preparation of transition metal oxides of the general formula $$A_xA'_{1-x}MO_3$$

wherein:
A is a lanthanide metal;
A' is a divalent metal;
M is a tetravalent transition metal; and
x is a whole or fractional number between 0 and 1 inclusive, wherein said method comprises a) injecting a decomposition agent into a solution comprising a solvent and a precursor metallic alkoxide or metallic salt; and b) heating said solution.

In another aspect, this disclosure relates to applications of these materials in fabricating nanoscale devices. These applications may include the fabrication of (a) nanometer-sized memory devices, such as a nano-memory stick, volatile and non-volatile random-access memory devices and (b) nanoscale electromechanical devices such as actuators, resonators, and force and motion sensors. Other devices include those based on the dielectric properties of the nanowires. These devices can be incorporated into the nanoscale electronic and electromechanical device architecture as well as silicon-based microelectronic circuitry. Yet other devices incorporating these nanowires include magnetic field sensors and magnetic recording and storage devices.

DETAILED DESCRIPTION

Figure 1:
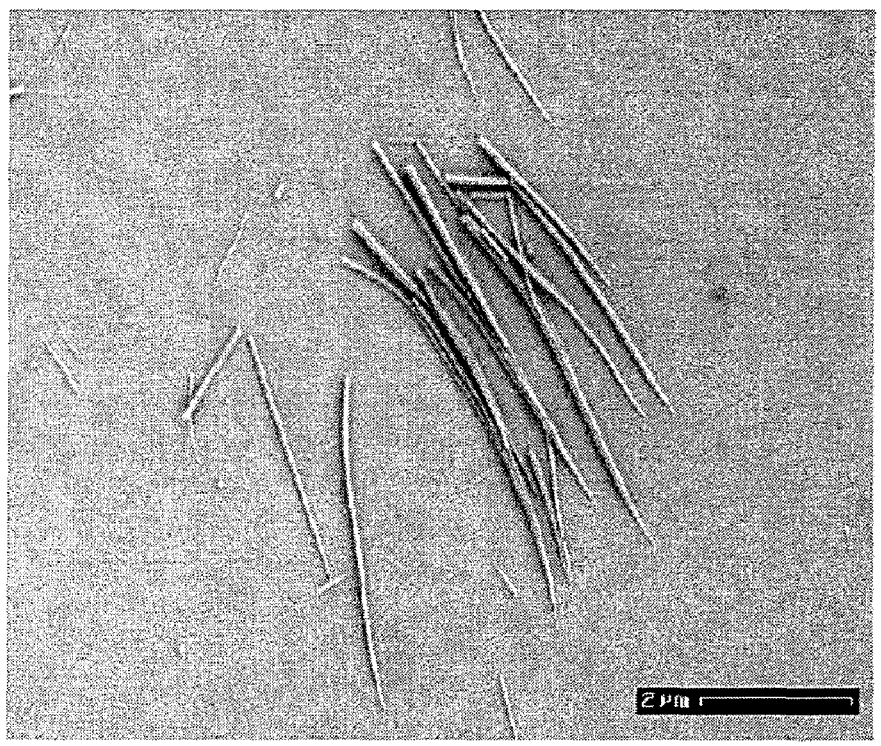
FIG. 1 depicts a low-magnification scanning electron micrograph showing $BaTiO_3$ nanowires prepared using solution-based synthesis.

This application generally relates to nanowires comprising transition-metal-oxides. The nanowires may have diameters ranging from about 5 to about 500 nm and may have lengths up to about 500 μm. The synthesis of these nanowires is accomplished by a solution-phase decomposition of metallic and bimetallic alkoxide precursors or metallic salt precursors. The solution phase decomposition may be facilitated by the presence of coordinating ligands.

Definitions

For convenience, before further description, certain terms employed in the specification, examples, and appended claims are collected here. These definitions should be read in light of the reminder of the disclosure and understood as by a person of skill in the art.

The articles "a" and "an" are used herein to refer to one or to more than one (i.e. to at least one) of the grammatical object of the article. By way of example, "an element" means one element or more than one element.

The term "aliphatic" is an art-recognized term and includes linear, branched, and cyclic alkanes, alkenes, or alkynes. In certain embodiments, aliphatic groups in the present disclosure are linear or branched and have from 1 to about 25 carbon atoms.

The term "alkyl" is art-recognized, and includes saturated aliphatic groups, including straight-chain alkyl groups, branched-chain alkyl groups, cycloalkyl (alicyclic) groups, alkyl substituted cycloalkyl groups, and cycloalkyl substituted alkyl groups. In certain embodiments, a straight chain or branched chain alkyl has about 10 or more carbon atoms in its backbone (e.g., $C_{10}$-$C_{30}$ for straight chain or branched chain).

Moreover, the term "alkyl" includes "substituted alkyls", which refers to alkyl moieties having substituents replacing a hydrogen on one or more carbons of the hydrocarbon backbone. Such substituents may include, for example, a hydroxyl, a carbonyl (such as a carboxyl, an alkoxycarbonyl, a formyl, or an acyl), a thiocarbonyl (such as a thioester, a thioacetate, or a thioformate), an alkoxyl, a phosphoryl, a phosphonate, a phosphinate, an amino, an amido, an amidine, an imine, a cyano, a nitro, an azido, a sulfhydryl, an alkylthio, a sulfate, a sulfonate, a sulfamoyl, a sulfonamido, a sulfonyl, a heterocyclyl, an aralkyl, or an aromatic or heteroaromatic moiety. It will be understood by those skilled in the art that the moieties substituted on the hydrocarbon chain may themselves be substituted, if appropriate. For instance, the substituents of a substituted alkyl may include substituted and unsubstituted forms of amino, azido, imino, amido, phosphoryl (including phosphonate and phosphinate), sulfonyl (including sulfate, sulfonamido, sulfamoyl and sulfonate), and silyl groups, as well as ethers, alkylthios, carbonyls (including ketones, aldehydes, carboxylates, and esters), —CN and the like. Exemplary substituted alkyls are described below. Cycloalkyls may be further substituted with alkyls, alkenyls, alkoxys, alkylthios, aminoalkyls, carbonyl-substituted alkyls, —CN, and the like.

Unless the number of carbons is otherwise specified, "longer chain alkyl" or "higher alkyl" refers to an alkyl group, as defined above, but having from ten to 20 carbons, alternatively from thirteen to about nineteen carbon atoms in its backbone structure.

The terms "alkoxyl" or "alkoxy" are art recognized and include an alkyl group, as defined above, having an oxygen radical attached thereto. Representative alkoxyl groups include methoxy, ethoxy, propyloxy, tert-butoxy and the like. An "ether" is two hydrocarbons covalently linked by an oxygen. Accordingly, the substituent of an alkyl that renders that alkyl an ether is or resembles an alkoxyl, such as may be represented by one of —O-alkyl, —O-alkenyl, —O-alkynyl, —O—$(CH_2)_m$-R61, where R61 represents an aryl, a cycloalkyl, a cycloalkenyl, a heterocycle or a polycycle; and m is zero or an integer in the range of 1 to 25.

The terms "amine" and "amino" are art-recognized and include both unsubstituted and substituted amines, e.g., a moiety that may be represented by the general formulas:

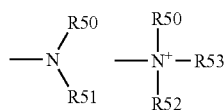

wherein R50, R51 and R52 each independently represent a hydrogen, an alkyl, an alkenyl, $-(CH_2)_m$-R61, or R50 and R51, taken together with the N atom to which they are attached complete a heterocycle having from 4 to 8 atoms in the ring structure; R61 represents an aryl, a cycloalkyl, a cycloalkenyl, a heterocycle or a polycycle; and m is zero or an integer in the range of 1 to 8. In certain embodiments, only one of R50 or R51 may be a carbonyl, e.g., R50, R51 and the nitrogen together do not form an imide. In other embodiments, R50 and R51 (and optionally R52) each independently represent a hydrogen, an alkyl, an alkenyl, or $-(CH_2)_m$-R61. Thus, the term "alkylamine" includes an amine group, as defined above, having a substituted or unsubstituted alkyl attached thereto, i.e., at least one of R50 and R51 is an alkyl group.

The term "amphipathic" is art recognized and refers to a compound with both a hydrophobic end and hydrophilic end.

The terms "comprise" and "comprising" are used in the inclusive, open sense, meaning that additional elements may be included The term "coordinating ligand" refers to compounds or molecules which may be able to donate electron density to a metal ion. This may be achieved by sharing an electron pair on the ligand molecule or ion with the central metal ion of the complex. A coordinating ligand may be, for example, an amphipathic or surfactant molecule or compound. Some representative coordinating moieties, which may be a coordinating ligand or part of a coordinating ligand include for example, $H_2O$, Cl—, amines, $NH_3$, hydroxy groups, and nitrate groups.

The term "decomposition agent" refers to an compound which facilitates chemical change. For example, decomposition agents may be an oxidant or an oxidizing material.

The term "ferroelectric" refers to materials which have a spontaneous electric polarization in the absence of an applied field that may be reversed by applying a potential field.

The term "lanthanide" is commonly understood to mean a series of elements in the periodic table generally considered to range in atomic number from cerium (58) to lutetium (71) inclusive.

The term "magnetoresistance" refers to the property wherein an electrical current flowing through a material, placed in a magnetic field, displays a decrease or increase, depending on orientation, in the resistance. Very large, or "colossal" magnetoresistance refers to greater than about a thousand fold change in resistivity which occurs as an external magnetic field is applied to the sample.

The term "metallic salts" is art-recognized, and include inorganic and organic acid addition salts of metals, including without limitation, transition metals. Examples of metallic salts include those derived from mineral acids, such as hydrochloric acid and sulfuric acid, and those derived from organic acids, such as ethanesulfonic acid, benzenesulfonic acid, p-toluenesulfonic acid, and the like. Examples of suitable inorganic bases for the formation of salts include the hydroxides, carbonates, and bicarbonates of ammonia, sodium, lithium, potassium, calcium, magnesium, aluminum, zinc and the like. Salts may also be formed with suitable organic bases, including those that are strong enough to form such salts. For purposes of illustration, the class of such organic bases may include mono-, di-, and trialkylamines, such as methylamine, dimethylamine, and triethylamine; mono-, di- or trihydroxyalkylamines such as mono-, di-, and triethanolamine; amino acids, such as arginine and lysine; guanidine; N-methylglucosamine; N-methylglucamine; L-glutamine; N-methylpiperazine; morpholine; ethylenediamine; N-benzylphenethylamine; (trihydroxymethyl)aminoethane; and the like. Further examples of salts include metallic acetates, metallic acetylacetonate hydrates, nitrates, nitrate hydrates, perchlorates, trifluoromethansulfonates, metallic hydrides, and the like.

The terms "nanowire" and "nanorod" both refer to a wire having a diameter from about one nanometer (nm) to about 500 nm. Nanowires may include regions in which charge carriers or conduction particles, for example, are confined quantum-mechanically in two dimensions orthogonal to the axis of the wire. In other embodiments, nanowires may include regions in which conduction particles are confined to a single dimension.

The term "or" as used herein should be understood to mean "and/or", unless the context clearly indicates otherwise.

The term "organic solvent" refers to a liquid which includes but is not limited to carbon and hydrogen.

The term "sulfonate" is art recognized and includes a moiety that may be represented by the general formula:

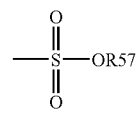

in which R57 is an electron pair, hydrogen, alkyl, cycloalkyl, or aryl.

The term "transition metal" is art-recognized, and refers to elements with electrons in a d or f orbital.

A. Metal Oxide Nanowires

In one embodiment, the nanowires comprise a transition metal oxide represented by

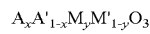

wherein:
  A and A' are each independently selected from group II, group III, group IV and lanthanide metals;
  M and M' are independently for each occurrence a transition metal;
  x is a whole or fractional number between 0 and 1 inclusive; and
  y is a whole or fractional number between 0 and 1 inclusive.

In another embodiment, the nanowires comprise a transition metal oxide represented by

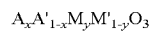

wherein:
  A and A' are each independently selected from group II and group IV metals;
  M and M' are each independently selected from a group IVB metal;
  x is a whole or fractional number between 0 and 1 inclusive; and
  y is a whole or fractional number between 0 and 1 inclusive.

In a particular embodiment, the group II and group IV metals are selected from Ba, Pb, and Sr. In another particular embodiment, the transition metal is tetravalent. In another embodiment, the transition metals are selected from Ti and Zr.

In one embodiment, x is about 1, y is about 0, and A is Ba. In another embodiment, x is about 0, y is about 1, and M is Ti or Zr.

In another embodiment, the nanowires comprise the transition metal oxides $BaTiO_3$, $PbZrO_3$, $PbZr_yTi_{1-y}O_3$ or $Ba_xSr_{1-x}TiO_3$, wherein x is a whole or fractional number between 0 and 1 inclusive, and y is a whole or fractional number between 0 and 1 inclusive.

In another embodiment, the nanowires comprise a transition metal oxide represented by $$A_xA'_{1-x}MO_3$$

wherein:
A is a lanthanide metal;
A' is a divalent metal;
M is a tetravalent metal; and
x is a whole or fractional number between 0 and 1 inclusive.

In an embodiment, M is selected from Mn, Tc, and Re. In another embodiment, A' is Ca. In yet another embodiment, A is La. In yet another embodiment, x is about 1 and A is La. In another embodiment, x is about 0 and A' is Ca.

In one embodiment, the length of the nanowire is greater than 100 nm, 1 μm, greater than 5 μm, greater than 10 μm, or even greater than 50 μm. In yet another embodiment, the diameter of the nanowire is less than 500 nm, less than 100 nm, less than 5 nm, or even less than 1 nm.

In one embodiment, the unit cell structure of the nanowires is the same as the corresponding bulk unit cell structure. In another embodiment, the unit cell structure of the nanowires is different than the corresponding bulk unit cell structure. In a particular embodiment, the crystal structure of the nanowires has the [001] direction aligned along the wire axis.

In another embodiment, the nanowires consist of a single crystal structure of the transition metal oxide. In another embodiment, the nanowires have a perovskite structure. In a further embodiment, the nanowires are composed of single-crystalline cubic perovskite metallic oxides with a principle axis of the unit cell preferentially aligned along the wire length.

In another embodiment, the nanowires have a very large magnetoresistance. In yet another embodiment, the nanowires comprise several electronic phases simultaneously.

Other materials may be incorporated in the nanowires. For example, the nanowires may comprise alternating regions of different transition metals or different transition metal oxides. The nanowires may further comprise semi-conducting materials, for example, silicon or silicon/germanium.

B. Method of Preparation of Metal Oxide Nanowires

In another aspect, this disclosure relates to the method of preparation of transition-metal-oxide nanowires comprising
a) injecting a decomposition agent into a solution comprising a solvent, a coordinating ligand, and a precursor metallic alkoxide or metallic salt; and
c) heating said solution.

In certain embodiments, the solution is heated to above about 200° C., above about 240° C., or even above about 260° C. In one embodiment, the precursor alkoxide has the form AM-alkoxide, wherein A is divalent metal and M is a tetravalent metal. In one embodiment, the solution further comprises another A'M' alkoxide or salt.

In an embodiment, the solvent has a boiling point above about 110° C., above about 150° C., about 200° C., or even above about 250° C. The precursor alkoxides or metallic salts may be substantially and/or partly dissolved in the solvent. The choice of solvent may facilitate the formation of the nanowires. In an embodiment, the solvent is an organic solvent. In an embodiment, the organic solvent is aprotic. In another embodiment, the organic solvent may be an aliphatic compound, an aromatic compound or a ketone. In one embodiment, the organic solvent is a long chain, or higher, alkyl. In another embodiment, the organic solvent is heptadecane.

In another embodiment, the coordinating ligand may be an amphipathic compound or a surfactant. For example, a coordinating ligand may be an amine containing compound, a fatty acid, a phosphorus containing surfactant, or a sulfur containing surfactant. Without being bound by any theories as to how the coordinating ligand operates, the coordinating ligand may create a micellar phase with the solution, and may form small pockets which allow the formation transition metal oxide nanowires, or the coordinating ligand may bind to the nanowire and direct growth along a particular axis.

In an embodiment, the coordinating ligand may be an acid or an amine. In one embodiment, the coordinating ligand is an amine with a long chain hydrocarbon. In an embodiment, the coordinating ligand is selected from bis (2-ethylhexyl) amine, tridodecylamine, palmitic acid, trihexylamine, tridecylamine, lauric acid, oleic acid, and trioctylamine, and trialkylphosphates.

Decomposition agents may be, for example, any oxidant or oxidizing material. In one embodiment, the decomposition agent may be a peroxide, chlorate, perchlorate, nitrate or permanganate. In another embodiment, the decomposition agent is selected from hydrogen peroxide and water. Without being bound by any theories as to how the decomposition agent operates, the decomposition agent may decompose the metallic precursors thus creating the transition metal nanowires.

The precursor alkoxide may be a bimetallic alkoxide. In an embodiment, the precursor alkoxide is a metallic or bimetallic isopropoxide. In an embodiment, the precursor alkoxide is $BaTi[OCH(CH_3)_2]_6$, or $SrTi[OCH(CH_3)_2]_6$. In another embodiment, the precursor alkoxide may be for example, $Mn(O\ i\text{-}Pr)_2$ or $Mn(OAc)_2.4H_2O$.

In another embodiment, the precursor metallic salt may have the form MX, wherein M is a trivalent or tetravalent metal, and X may be a conjugate acid or a conjugate base.

The reaction time of preparing the transition metal nanorods will vary with different metallic precursors, the composition and temperature of the solution, and independently, the choice of solvent, coordinating ligand and decomposition agent. The reaction time may be controlled to select a desired length and/or diameter of the nanowires. For example, the reaction times may be a period of time from about 1 hour to about 24 hours. In general, the length of a nanowire is a function of the length of reaction time.

In another embodiment, this disclosure relates to the method of preparation of transition metal oxides of the general formula $$A_xA'_{1-x}M_yM'_{1-y}O_3$$

wherein:
A and A' are each independently a divalent or a trivalent metal;
M and M' are each independently a tetravalent metal;
x is a whole or fractional number between 0 and 1 inclusive; and y is a whole or fractional number between 0 and 1 inclusive; the method comprising:

a) injecting a decomposition agent into a solution comprising a solvent and a precursor metallic alkoxide or metallic salt; and b) heating said solution.

The synthesis of transition-metal-oxide nanowires may be performed using solution-based decomposition of organometallic precursors where for example, the precursors may be AM isopropoxide and A'M' isopropoxide, wherein A and A' are divalent metals such as Ba, Pb, Sr and wherein M and M' are tetravalent metals such as for example,Ti and Zr in stoichiometric proportion. Schematically, the reaction proceeds by injecting a decomposition agent into hot solvents with precursors (e.g. AM alkoxide and A'M' alkoxide) and, optionally, coordinating ligands and by heating them to appropriate temperatures. In another embodiment, the method further comprises heating the solution to about 100° C.-130° C. before injecting a decomposition agent.

The metallic precursor may also be a metallic salt, for example, lanthanide salts, which include for example lanthanum nitrate hexahydrate, lanthanum oxide, lanthanide oxalates, lanthanide carbonates, lanthanide acetates, lanthanide sulfates, lanthanide hydroxides, and lanthanide chlorides.

The reaction product is rinsed and collected after the reaction is complete. The nanowires may be manipulated in solution.

Similar procedures can be applied to diverse materials of the composition, by changing the precursors, coordinating ligands, solvents, and other reaction conditions. In one embodiment, the preparation of lead zirconium titanium oxide, $PbZr_xTi_{1-x}O_3$, (PZT), an industrially important ferroelectric material in the bulk, can be performed using the same procedure using for example, lead zirconium isopropoxide and lead titanium isopropoxide (for PZT). In another embodiment, the preparation of barium strontium titanate, $Ba_xSr_{1-x}TiO_3$, (PST), which in the bulk may be an industrially important dielectric material, can be performed, for example, using barium titanium isopropoxide and strontium titanium isopropoxide in stoichiometric proportions as precursors.

The synthesis of transition-metal-oxide nanowires can be modified in many different ways. Different combinations of precursors, ligands, and solvents can be used to effect the same results. In one embodiment, the bimetallic alkoxide precursors with the general formula A-M alkoxide may be used with various primary, secondary, and tertiary alcohols in the synthesis. In another embodiment, coordinating organic ligands and polymers may be used in the synthesis including, for example, acids and amines with long-chain hydrocarbon tails, or higher alkyls. In a particular embodiment, the coordinating ligand is an oleic acid. In yet another embodiment, decomposition agents may be used, for example hydrogen peroxide at varying concentration, for example, about 3% to about 50% in water, or water alone. In another embodiment, any non-coordinating solvent with a boiling point above 110° C. can be used in the synthesis.

C. Devices of Metal Oxide Nanowires

The devices fabricated from these nanowires offer significant advantages over conventional bulk and thin-film devices. The advantages include (i) the reduced device size and extraordinary high level of integration ($>10^{12}$ devices/cm$^2$) due to the nanoscale dimensions, (ii) ultrahigh-frequency (>GHz) device operations due to their high resonance and switching frequency, (iii) low operation voltage due to the nanoscale dimension of nanowires, (iv) low production cost due to the unique synthetic methods, and (v) a completely new approach for device fabrications using solution-based methods.

Figure 8:
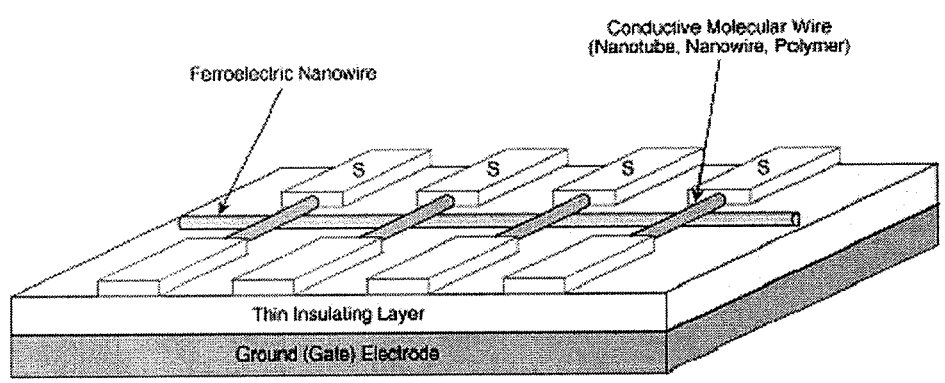
FIG. 8 depicts a schematic diagram of a nanoscale non-volatile ferroelectric memory device based on transition-metal-oxide nanowires and conducting molecular wires.

In one embodiment, the devices fabricated from these transition-metal-oxide nanowires exhibiting ferroelectric properties are non-volatile nano-memory devices. In an embodiment, the nano-memory device comprises ferroelectric nanowires and their arrays under conducting molecular wire arrays (FIG. 8). Conducting molecular wires may be any semiconductor and metallic nanowires, carbon nanotubes, and conducting polymers. The voltage applied between a conducting molecular wire and the underlying substrate may be used to set the electrical polarization state of a ferroelectric nanowire section directly under the molecular wire ("writing" information bits). This polarization can be "read" by measuring the low-bias conductivity of a molecular wire due the field-induced carrier depletion effected by the polarization.

Figure 6:
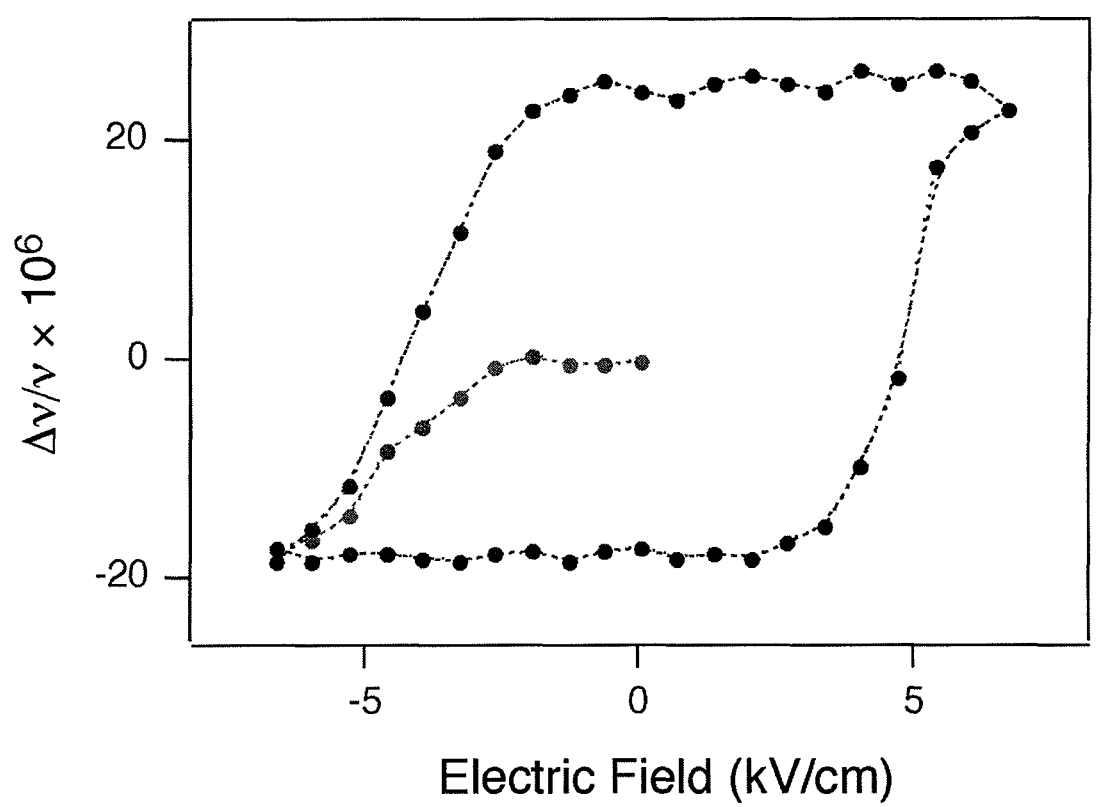
FIG. 6 depicts the fractional shift in the cantilever resonance frequency as a function of the applied field and illustrates the non-volatile nature of information bits written on a nanowire and the hysteresis behavior of polarization switching.
Figure 7:
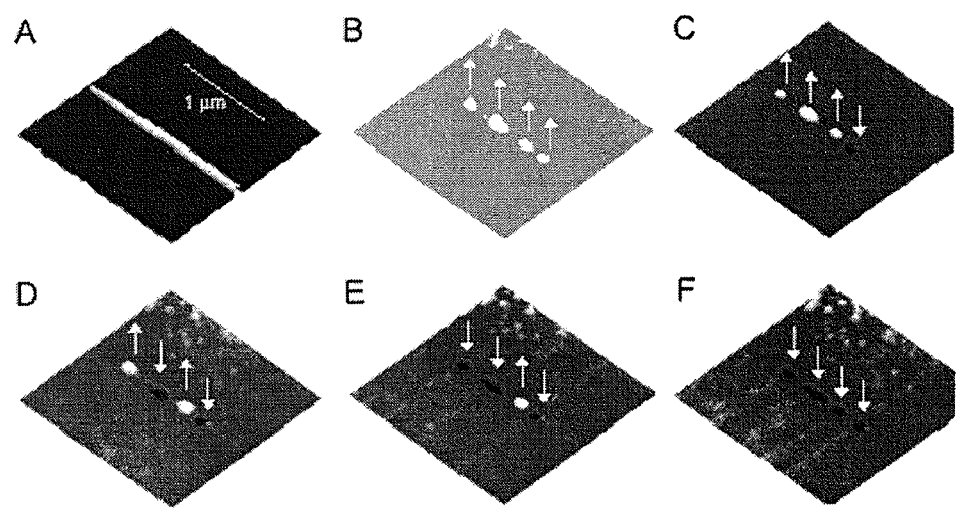
FIG. 7 depicts AFM images which illustrate a nano-memory stick: (a) with 13-nm diameter nanowire: (b)-(f) a series of EFM images showing four information bits (each representing 0 or 1) written on the nanowire.

In an embodiment, each conducting molecular wire may be connected to source and drain electrodes defined by lithography or micro-contact printing, but ferroelectric wires do not need to be connected to electrodes. The whole structure is placed on top of a conductive substrate with a thin oxide layer. Both ferroelectric nanowires and conducting molecular wires can be placed into their proper positions by solution-based assembly using microfluidic flow or electric-field-guided positioning. In this embodiment, the voltage applied between a conducting molecular wire and the underlying substrate is employed to set the electrical polarization state of a ferroelectric nanowire section directly under the molecular wire, hence writing the memory bits as electric polarization direction in the ferroelectric nanowire (FIGS. 6 and 7). FIG. 6 illustrates the fractional shift in the cantilever resonance frequency as a function of the writing voltage ($V_{tip}$) that shows the hysteresis behavior of polarization switching. The electrostatic force felt by the tip and hence the magnitude of electric polarization written on the nanowire is directly proportional $\Delta v/v$. Each data point in the plot was obtained by applying the writing voltage for 3 minutes and subsequently measuring the shift in the cantilever resonance frequency. The scan sequence was from 0 to −10 V, −10 V to 10 V (blue), and 10 V to −10 V. The distance between the tip and the top surface of the nanowire was 10 nm during the writing procedure, and it was 35 nm during the reading procedure. In one embodiment, writing information bits are written by applying a voltage ($V_{tip}$) to a conductive AFM tip while it stays over a particular spot of a nanowire. This procedure leads to the non-volatile bit (electric polarization) written on that particular spot. For example, the second panel of FIG. 5$d$ shows an electrostatic force microscope (EFM) image of the as-deposited nanowire, and the third and fourth panels show EFM images obtained after the writing procedure with $V_{tip}=-10V$ and $V_{tip}=+10V$, respectively. All EFM images shown in FIG. 5 were obtained by subtracting an EFM image at $V_{tip}=+2V$ from that at $V_{tip}=-2V$. The distance between the tip and the top of the surface of the nanowire was 10 nm during the writing procedure, and it was 35 nm during the reading procedure.

In a particular embodiment, the information bits may be as small as 10 nm×10 nm that corresponds to the information density of ~$10^{12}$ bit/cm$^2$.

In one embodiment, the information bits are non-volatile. In a particular embodiment, changing the bit by flipping the direction of electrical polarization from 0 to 1 or vice versa requires at least 5 kV/cm, at least 20 kV/cm. In another embodiment, the bits are stable without applied voltage.

In one embodiment, these memory bits can be read by measuring the low-bias conductivity of a molecular wire: due to the field-induced carrier depletion effected by the polarization (or equivalently, the surface charge) of the ferroelectric nanowire, the conductivity may exhibit two stable states that constitute memory bits. The positioning of nanowires as well as the electrode geometry will be determined by specific memory architectures. In a particular embodiment, information bits are read by the response of an AFM (atomic force microscopy) tip to the electric polarization which is detected by measuring the electrostatic force between the tip and the wire.

In one embodiment, the nanowires comprise a non-volatile memory nanostick, with a nanowire with information bits, (representing 0 or 1) written on the nanowire. In one embodiment, the information bits written on a nanowire can be independently manipulated.

Figure 9:
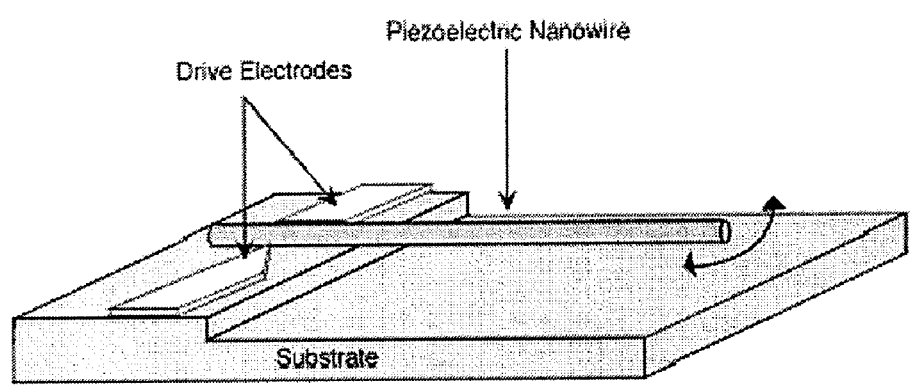
FIG. 9 depicts a schematic diagram of a nanoscale electro-mechanical actuator based on individual transition-metal-oxide nanowires.
Figure 10:
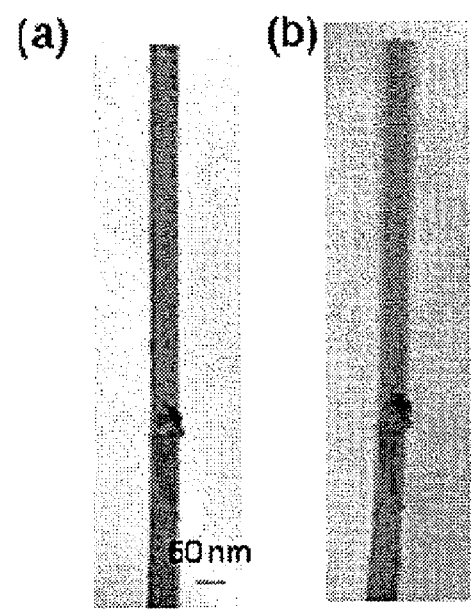
FIG. 10 depicts a transmission electron micrographs of a 50-nm diameter nanowire (a) without and (b) with the surface charge induction using an electron beam, inducing motion.

In another embodiment, transition-metal-oxide nanowires exhibiting converse-piezoelectric properties can be used to fabricate electromechanical actuators to position and move nanometer-sized objects for physical, chemical, and biological applications. In one embodiment, a nano-electromechanical actuator comprises a nanowire placed between two drive electrodes defined by, for example, lithography or micro-contact printing (FIG. 9). The drive-electrode configuration may differ for specific applications. The voltage applied to the drive electrode leads to mechanical deformation of the nanowire due to its converse-piezoelectricity (FIG. 10). In this embodiment, the nanowires will be placed between the electrodes by solution-based assembly using microfluidic flow or electric-field-guided positioning. The moving end of the nanowire would be suspended while the other end would be pinned by the substrate or lithographic structures. The positioning of nanowires as well as the electrode geometry may be determined by specific applications of actuators, following the well-developed design principles of bulk piezo actuators. FIG. 10 shows the comparison of a 50 nm diameter nanowire with and without surface charge induction and clearly illustrates the image blurring of a suspended nanowire tip caused by the electromechanical oscillation of the nanowire.

Figure 11:
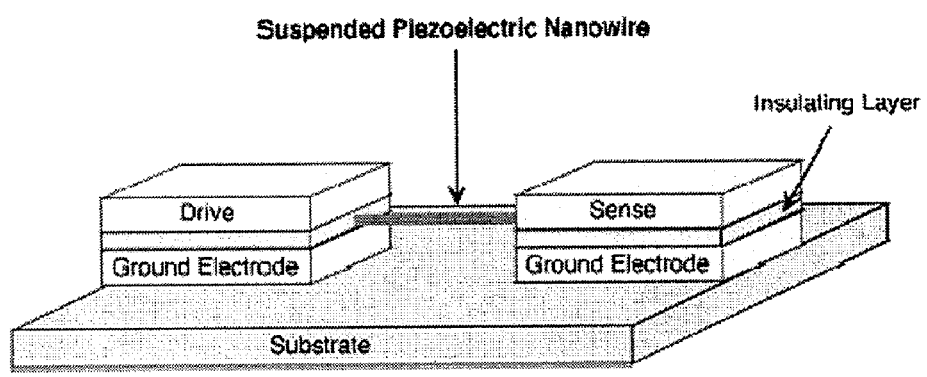
FIG. 11 depicts a schematic diagram of a nanoscale electromechanical beam resonator based on individual transition-metal-oxide nanowires.

In another embodiment, transition-metal-oxide nanowires with piezoelectric properties can be used to fabricate electromechanical resonators. The applied voltage on the drive electrode results in the deformation of the piezoelectric nanowire at a particular resonance frequency of the beam. This resonant oscillation can be detected by the sense electrode via piezoelectric effect. These electromechanical resonators can act as an ultrahigh frequency (>GHz) bandpass filters in telecommunication applications, replacing the bulky inductive-capacitance filters used today. In one embodiment, an electromechanical resonator comprising transition metal oxide nanowires comprises a suspended nanowire between drive and sense electrodes (FIG. 11). Another electrode that acts as ground would also be placed under the nanowire. In this embodiment, the nanowires will be placed between electrodes by solution-based assembly using microfluidic flow or electric-field-guided positioning. The drive electrode couples the input electrical signal to the resonant mechanical oscillation of the nanowire via converse-piezoelectric effect, and the sense electrode detects this mechanical oscillation by detecting the voltage developed at the surface of the nanowire via piezoelectric coupling. The operation frequency of the resonator is determined by the natural resonance frequency of the mechanical beam (i.e. the piezoelectric nanowire), and it is inversely proportional to the square of the nanowire length. The specific geometry of the resonator will vary based on applications as well as operation frequency.

Figure 12:
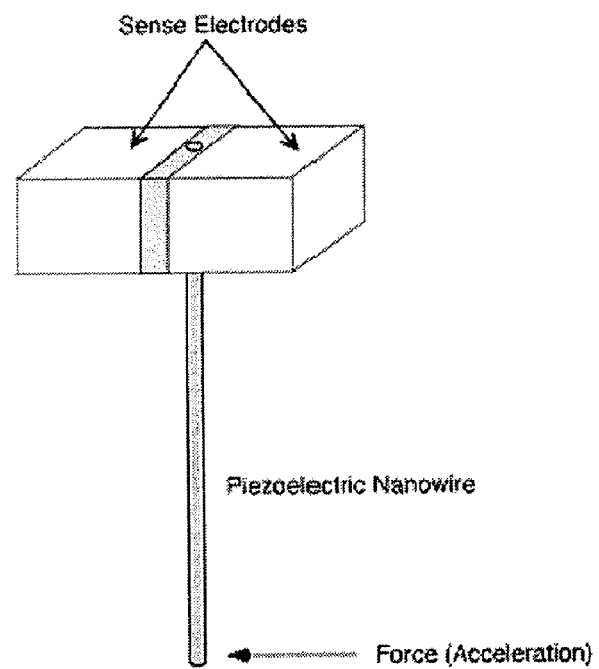
FIG. 12 depicts a schematic diagram of a nanoscale force sensor that can also act as an accelerometer.

In yet another embodiment, transition-metal-oxide nanowires with piezoelectric properties can be used to fabricate nanometer-sized force sensors for chemical and biological applications. One embodiment of the nanometer-sized force sensors would be to place a suspended nanowire between two clamping sense electrodes (FIG. 12). The mechanical force applied to the suspended end of the nanowire would result in the mechanical deformation of the nanowire, which, in turn, can be detected by measuring the voltage developed at the opposite surfaces of the nanowire using sensing electrodes. Unlike usual mechanical cantilevers, this piezoelectric-nanowire-based force sensor does not have to be driven by electrical currents, while it maintains the extreme force sensitivity.

In another embodiment, transition metal oxide nanowires with magneto-resistance properties may be used for storage media such as for example, read heads, computer storage media, and the like. In another embodiment, these nanowires may be used to detect magnetic fields.

Transition metal nanowires may be used for nanowire arrays for EMI shielding and composite materials with optimal thermal, electrical and mechanical properties. They may also be used for chemical gas sensing, robust low power microsensors and microsensor arrays with high sensitivity and selectivity, and microanalysis systems. Nanowires may also be used for scanning probe and scanning microscopy standards, flat panel displays, vacuum microelectronics for harsh enviroments, field emission cathodes, photonic band gap materials and devices, photovoltaics, radiation detection, electroluminescent and lasing materials and devices, components for mesoscopic energy sources, and microelectromechanical devices. Single nanowires can control current flow, emit light, process or store information, and dissipate heat.

In another embodiment, transition metal nanowires may be used for labeling or imaging and separation of biological cells. In part these embodiments may be manifested by the magnetic properties of the nanowires. Metal oxide nanowires may also be used for biological cell labeling, MRI, ferrofluids, and electrodes.

The methods disclosed herein may be employed for preparing electrically-conducting nanowires that are useful for example as nano-scale, vertically connecting wires between circuit device layers and for in-plane connecting wires between adjacent electrical contact pads. For circuit interconnections, such as between two circuit layers or mating devices, the use of many, sub-divided parallel conductive paths can be achieved with aligned nanowires. The nanowires may provide elastic compliance and flexibility of the interconnection medium which are advantageous in avoiding short and long-term reliability problems, e.g., caused by undesirable stresses. Common sources of stresses exerted on the interconnection medium include local temperature gradients, stresses arising from mismatches of the thermal expansion coefficients between different materials used in the devices, and electromigration-induced stresses, and mechanical and thermal stresses introduced during device assembly, handling, testing, or shipping. When small-diameter nanowires are utilized, these may be useful for achieving high- or ultra-high density circuit interconnections. In another embodiment, these nanowires may be used as magnetic field sensors, for example, in electronic equipment, wireless telephonic transmission and transportation devices, for example, automobiles.

Exemplification

The invention now being generally described, it will be more readily understood by reference to the following examples, which are included merely for purposes of illustration of certain aspects and embodiments of the present invention, and are not intended to limit the invention.

EXAMPLE 1

BaTiO$_3$ Nanowire Synthesis

Figure 2:
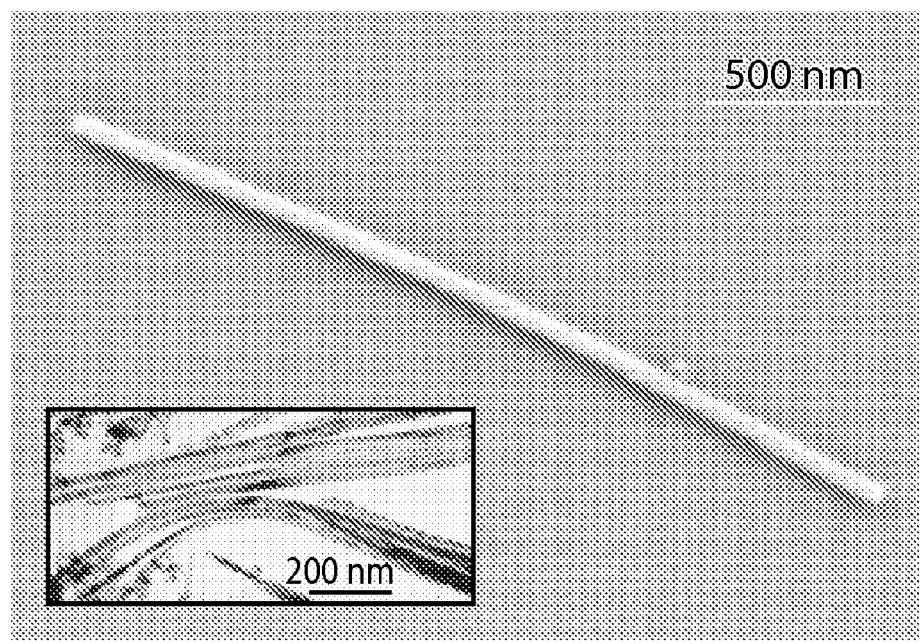
FIG. 2 depicts a scanning electron micrograph (SEM) image of an isolated $BaTiO_3$ nanowire with a 33-nm diameter. The inset shows a transmission electron microscope (TEM) image of the reaction product that consists of nanowire $BaTiO_3$ bundles and nanoparticle aggregates.

Three mmol (1.62 g) of barium titanium isopropoxide complex (precursor) is added to 0.3 mmol (0.084 g) of oleic acid (a coordinating ligand) in 10 mL of heptadecane (solvent) (10:1 molar ratio) under inert atmosphere. The reagent mixture is then stirred and heated up to 100° C., and 4 mL of a 3% H$_2$O$_2$ solution is injected into the mixture. After injection, the reaction mixture is heated to 280° C. for 3-12 hours. During this time, the reaction mixture turns from yellow to white as the vigorous bubbling that follows injection subsides. After 3 hours, the reaction is cooled to room temperature. The remaining solution is then washed with methanol and centrifuged to flocculate the nanowires. The supernatant is discarded. The flocculate is then washed with hexane and centrifuged repeatedly to eliminate any remaining heptadecane. After the final centrifugation step, the supernatant is discarded, and the precipitate is dried under vacuum, producing dried nanowires. These nanowires can be resuspended in solvents via sonication. A BaTiO$_3$ nanowire with a 33 nm diameter is shown in FIG. 2.

EXAMPLE 2

Characterization of BaTiO$_3$ Nanowires

Figure 3:
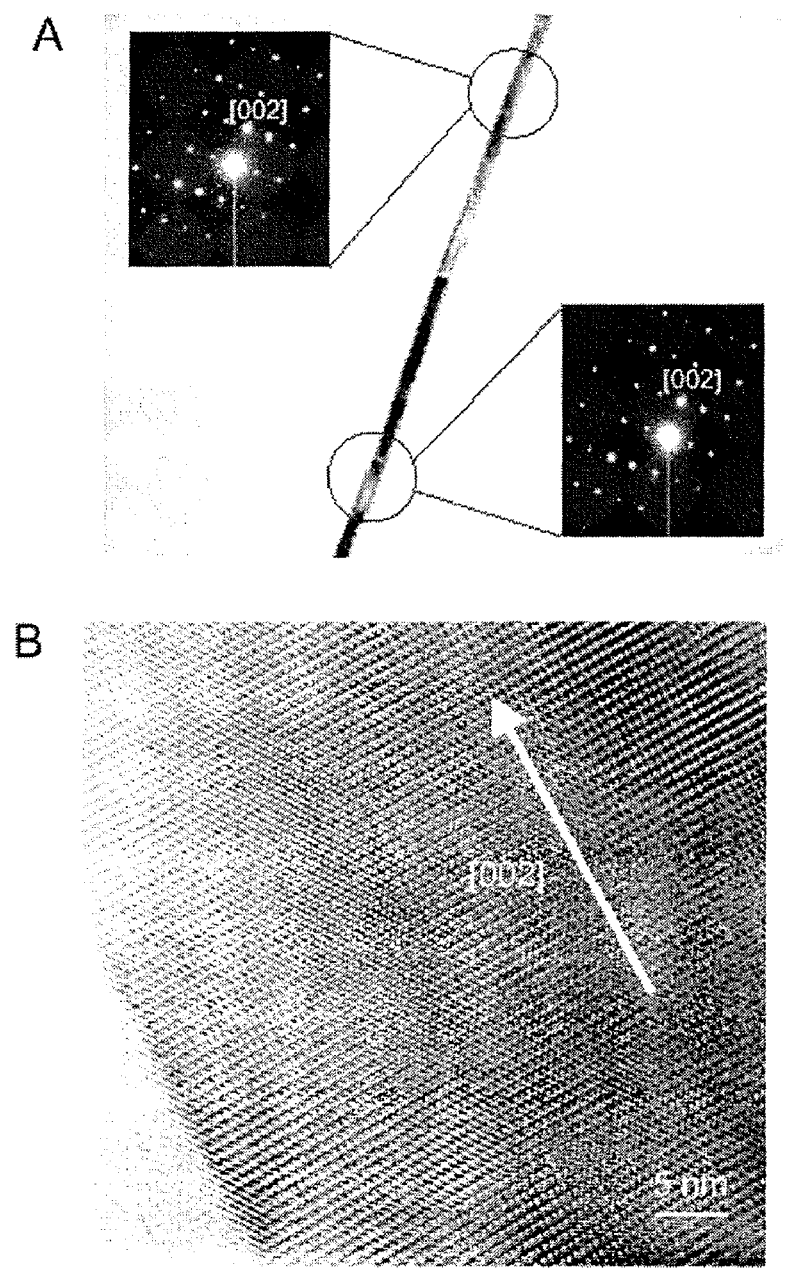
FIG. 3a depicts a high-resolution transmission electron micrograph (TEM) of a $BaTiO_3$ nanowire. The inset shows two convergent beam electron diffraction (CBED) patterns.
FIG. 3b shows a high-resolution TEM of a $BaTiO_3$ nanowire with a diameter of ~40 nm that shows lattice fringes perpendicular to the [002] direction.
Figure 4:
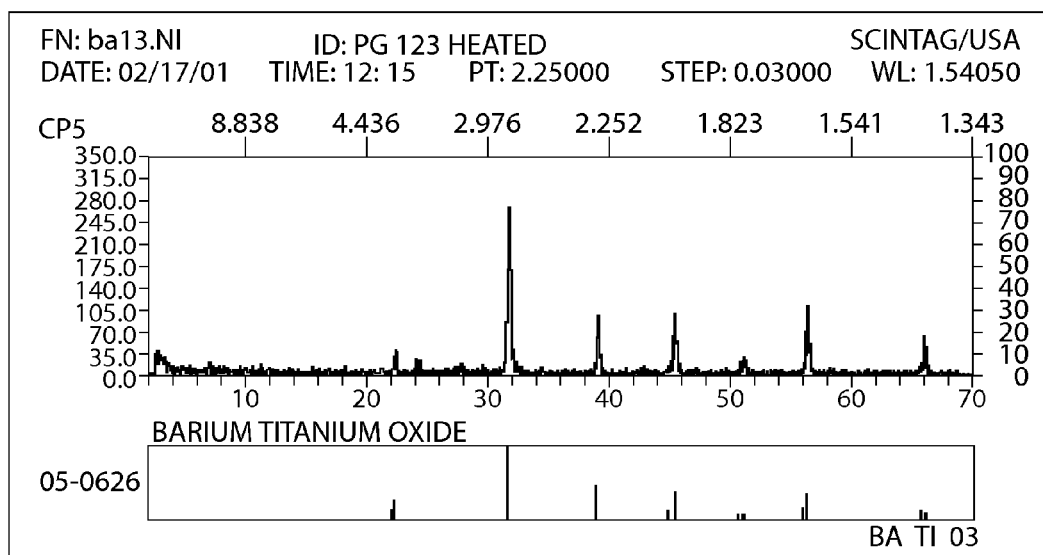
FIG. 4 depicts a X-ray diffractogram of a $BaTiO_3$-nanowire ensemble illustrating the same unit cell structure as bulk $BaTiO_3$.
Figure 5A:
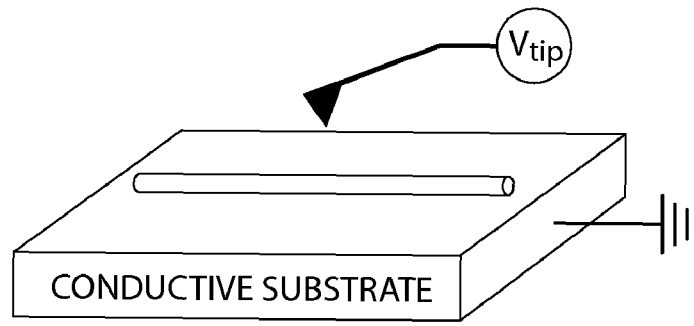
FIG. 5a depicts an experimental procedure employed to demonstrate reading and writing of non-volatile information bits (i.e., 0 and 1) written on a nanowire.
Figure 5B:
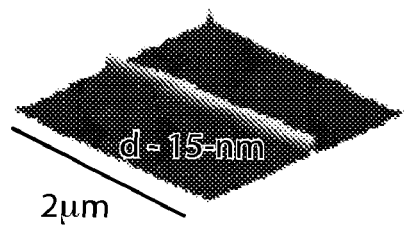
FIG. 5b depicts an atomic force microscopy (AFM) topographic image of a 10-nm diameter $BaTiO_3$ nanowire.
Figure 5C:
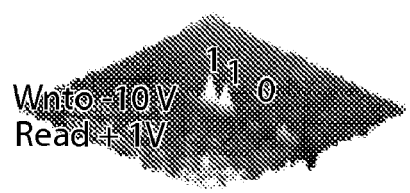
FIG. 5c depicts an electric force microscopy (EFM) image of the same nanowire after two bits, represented by a bright peak (a bit 1) or dark spot or depression (bit 0), are written on it.
Figure 5D:
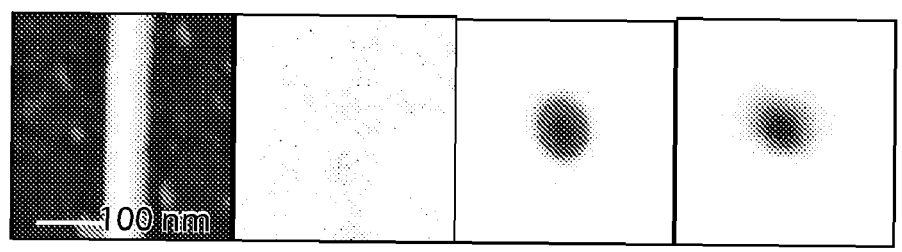
FIG. 5d depicts show a topographic image of an 18-nm diameter $BaTiO_3$ nanowire (left image) and EFM images from the same wire, depicting zero contrast, writing at +10V, and writing at −10V, as shown from left to right.

The analysis using scanning electron microscopy (FIGS. 1 and 2), transmission electron microscopy (FIG. 3), X-ray diffractometry (FIG. 4) reveals that the reaction products are single-crystalline BaTiO$_3$ nanowires with diameters from 3 nm to 100 nm and lengths up to >10 μm.

EXAMPLE 3

Preparation of Precursor Barium Alkoxide Precursors

The precursors were synthesized by the following procedure in an inert atmosphere: 65.0 mmol of barium metal was added to a flask containing 112 mL anydrous benzene, 21 ml isopropanol, and 19.5 ml titanium (IV) isopropoxide and stirred vigorously until the added metal was completely dissolved. The solution exhibited a deep purple color within minutes and gradually became white. Once the metal was dissolved, the solution was placed at 4° C. as the precursor precipitated out of the solution. The precipitated precursors were dried overnight, resulting in a fine white powder, with a formula of BaTi(O-iPr)$_6$.

EXAMPLE 4

Preparation of Precursor Strontium Alkoxide Precursors

The precursors were synthesized by the following procedure in an inert atmosphere: 65.0 mmol of strontium metal was added to a flask containing 112 mL anydrous benzene, 21 ml isopropanol, and 19.5 ml titanium (IV) isopropoxide and stirred vigorously until the added metal was completely dissolved. The solution exhibited a deep purple color within minutes and gradually became white. Once the metal was dissolved, the solution was placed at 4° C. as the precursor precipitated out of the solution. The precipitated precursors were dried overnight, resulting in a fine white powder, with a formula of SrTi(O-iPr)$_6$.

EXAMPLE 5

Synthesis of LaMnO$_3$ Nanowires

About 3.0 mmol of La(NO$_3$)$_3$.6H$_2$O (Aldrich, 99.99%) and 3.0 mmol of Mn(OAc)$_2$.4H$_2$O (Aldrich, 99+%) are added to a reaction flask along with 2.0 g of heptadecane (Alfa Aesar, 99%) and a coordinating ligand (see below). The reaction vessel is then connected to a schlenk line under nitrogen. 1 mL of H$_2$O is then added at room temperature to dissolve the lanthanum and manganese salts. After the salts are dissolved, 8 mL of a 30% H$_2$O$_2$ solution is added to the mixture via a single injection. After injection, the reaction temperature is then raised to 100° C. for 3 hours and the mixture changes color from clear to black. The reaction mixture is subsequently raised to 280° C. for 4 hours. The resulting black solid is then washed with hexanes and centrifuged repeatedly to eliminate any remaining heptadecane. After the final centrifugation step the material is then dried under vacuum to produce a black powder of LaMnO$_3$ nanowires.

Results have also been produced with the following coordinating ligands and concentrations: bis (2-ethylhexyl) amine, 9.0 mmol (Aldrich, 99%); tridodecylamine, 1.0 mmol (Aldrich, 95%), palmitic acid, 3.0 mmol (Aldrich, 99%).

EXAMPLE 6

Alkoxide Routes to Production of LaMnO$_3$

About 10.0 mmol of lanthanum pieces (Aldrich, 99.5%) and 10.0 mmol of Mn(OiPr)$_2$ (Chemat Technology Inc., 99%) are added to a solution of 5 mL of isopropanol (Aldrich, 99%) and 3 mL of benzene (Aldrich, 99%). The reaction was conducted at room temperature in a circulating nitrogen glovebox by stirring with a magnetic stirrer until the metal is completely dissolved. The reaction vessel is then connected to a schlenk line under nitrogen. 5 mL of a 30% H$_2$O$_2$ solution is added to the mixture via a single injection at room temperature. After injection, the reaction temperature is then raised to 100° C. for 3 hours and then to 280° C. for 4 hours. The resulting solid is then washed with hexanes and centrifuged repeatedly to eliminate any remaining solvent. After the final centrifugation step the material is then dried under vacuum to produce a powder of LaMnO$_3$ nanowires.

EXAMPLE 7

Alkoxide Routes to Production of CaMnO$_3$

About 10.0 mmol of calcium pieces (Aldrich, 99.5%) and 10.0 mmol of Mn(OiPr)$_2$ (Chemat Technology Inc., 99%) are added to a solution of 5 mL of isopropanol (Aldrich, 99%) and 3 mL of benzene (Aldrich, 99%). The reaction was conducted at room temperature in a circulating nitrogen glovebox by stirring with a magnetic stirrer until the metal is completely dissolved. The reaction vessel is then connected to a schlenk line under nitrogen. 5 mL of a 30% H$_2$O$_2$ solution is added to the mixture via a single injection at room temperature. After injection, the reaction temperature is then raised to 100° C. for 3 hours and then to 280° C. for 4 hours. The resulting solid is then washed with hexanes and centrifuged repeatedly to eliminate any remaining solvent. After the final centrifugation step the material is then dried under vacuum to produce a powder of $CaMnO_3$ nanowires.

EXAMPLE 8

Synthesis of Doped Nanowires of $La_{(1-x)}Ca_xMnO_3$

The synthesis of doped, or mixed nanowires of the composition $La_{(1-x)}Ca_xMnO_3$ proceeds similarly to the synthesis of $LaMnO_3$ or $CaMnO_3$ nanowires described above. To achieve the desired dopant concentration, one substitutes the desired molar quantity of $Ca(NO_3)_2.4H_2O$ for that of $La(NO_3)_3.6H_2O$.

EXAMPLE 9

Synthesis of Doped Nanowires of $Ba_{(1-x)}Sr_xTiO_3$

The synthesis of doped, or mixed nanowires of the composition $Ba_{(1-x)}Sr_xTiO_3$ proceeds similarly to the synthesis of $BaTiO_3$ nanowires described above. To achieve the desired dopant concentration, one substitutes the desired molar quantity of strontium titanium isoproxide complex (precursor) for that of barium titanium isopropoxide complex (precursor).

INCORPORATION BY REFERENCE

All publications and patents mentioned herein, are hereby incorporated by reference in their entirety as if each individual publication or patent was specifically and individually indicated to be incorporated by reference. In case of conflict, the present application, including any definitions herein, will control.

EQUIVALENTS

Those skilled in the art will recognize, or be able to ascertain using no more than routine experimentation, many equivalents to the specific embodiments of the invention described herein. Such equivalents are intended to be encompassed by the following claims.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements.

We claim:

1. A method of preparing transition-metal-oxide nanowires comprising:
   a) injecting a decomposition agent into a solution comprising a solvent, a coordinating ligand, and a precursor metallic salt; and
   b) heating said solution.

2. The method of claim 1, wherein said solution is heated to above about 200° C.

3. The method of claim 1, wherein said solvent is an organic solvent.

4. The method of claim 1, wherein said coordinating ligand comprises an amine.

5. The method of claim 1, wherein said decomposition agent is selected from the group consisting of peroxides, chlorates, perchlorates, nitrates, permanganates, and water.

6. The method of claim 1, wherein said precursor metallic salt has the form MX, wherein M is a trivalent or tetravalent metal, and X is an acid or base.

* * * * *